United States Patent [19]

Suzuki et al.

[11] Patent Number: 5,309,401
[45] Date of Patent: May 3, 1994

[54] STATIC MEMORY DEVICE

[75] Inventors: Azuma Suzuki, Tokyo; Masataka Matsui, Yokohama, both of Japan

[73] Assignee: Kabushiki Kaisha Toshiba, Tokyo, Japan

[21] Appl. No.: 979,623

[22] Filed: Nov. 19, 1992

[30] Foreign Application Priority Data

Nov. 21, 1991 [JP] Japan ................. 3-305978

[51] Int. Cl.$^5$ .............. G11C 7/00; G11C 11/40
[52] U.S. Cl. ............... 365/203; 365/189.11; 365/190; 365/226
[58] Field of Search .......... 365/203, 189.11, 189.09, 365/189.04, 230.06, 233, 233.5, 189.06, 189.01, 230.01, 226, 227, 228, 190

[56] References Cited

U.S. PATENT DOCUMENTS

| | | | |
|---|---|---|---|
| 4,947,374 | 8/1990 | Wada et al. | 365/195 |
| 4,961,168 | 10/1990 | Tran | 365/189.11 |
| 4,975,877 | 12/1990 | Bell | 365/189.01 |
| 5,222,041 | 6/1993 | Nishimori et al. | 365/189.01 |

FOREIGN PATENT DOCUMENTS 0345065  12/1989  European Pat. Off. ....... 365/189.01

Primary Examiner—Eugene R. LaRoche
Assistant Examiner—Son Mai
Attorney, Agent, or Firm—Spensley Horn Jubas & Lubitz

[57] ABSTRACT

A static memory device comprises a memory cell array having of a plurality of sections, each including a plurality of memory cells. A selection signal for selecting one section is generated in accordance with a data writing or reading operation. First and second potentials of high level are generated, and one of the potentials are selectively supplied to pairs of bit lines in one of the plurality of sections. In a data writing operation, the pairs of bit lines are precharged to the first potential, e.g., the supply voltage $V_{cc}$, and in a data reading operation, the pair of bit lines is precharged to the second potential, e.g., $V_{cc} - 2V_f$, where $V_f$ is a forward voltage of a diode.

14 Claims, 4 Drawing Sheets

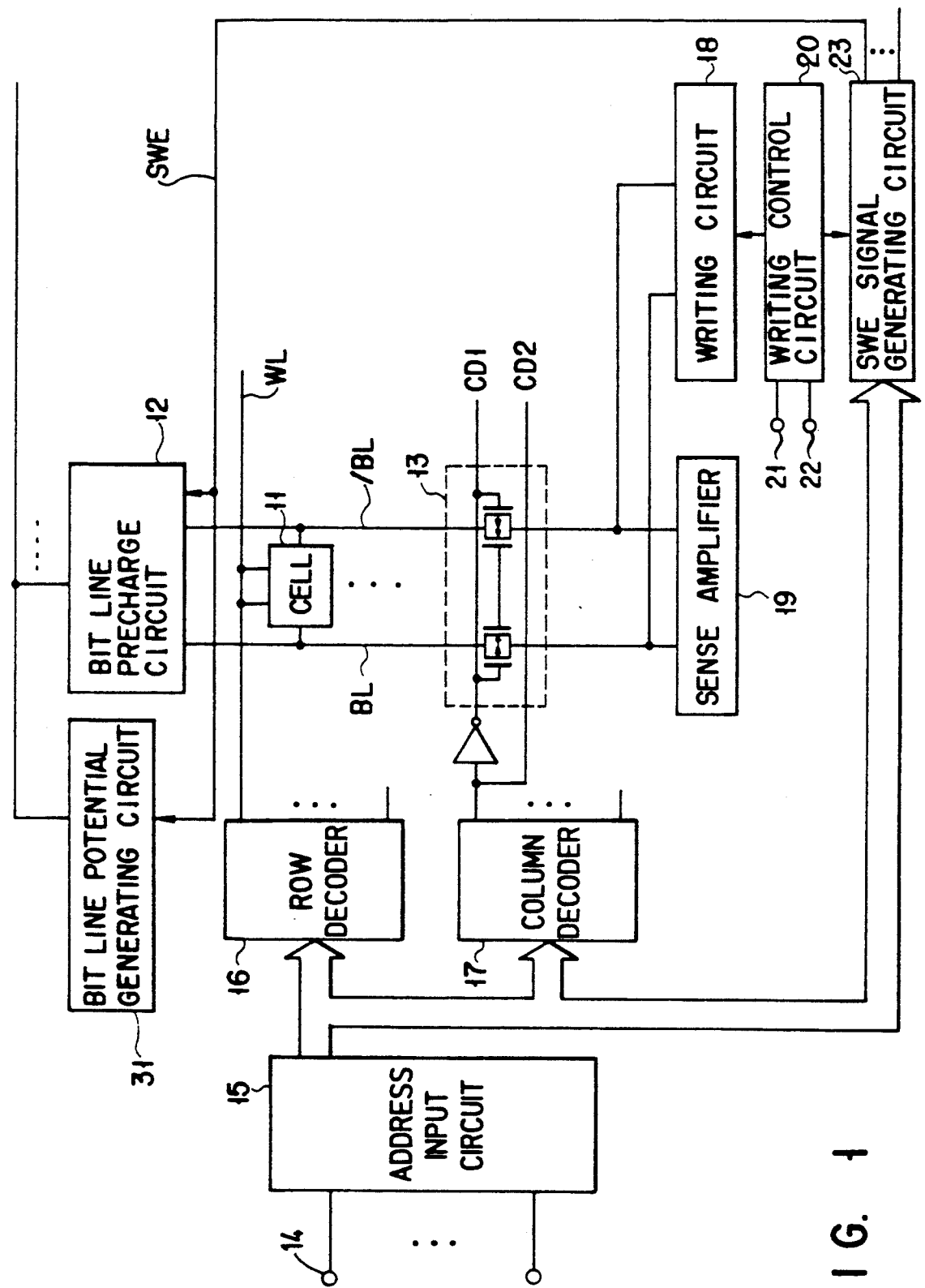
F I G. 1

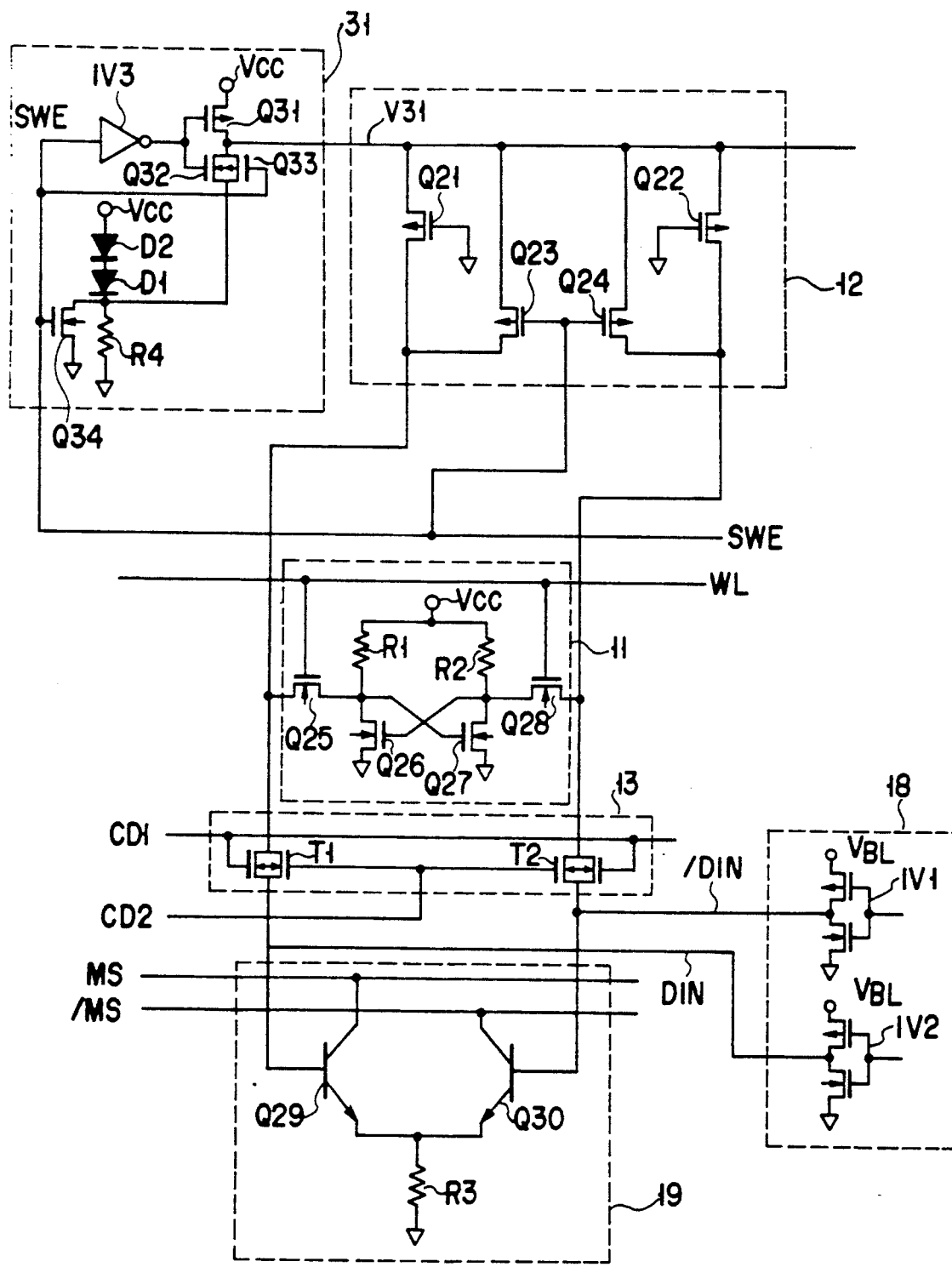
F I G. 2

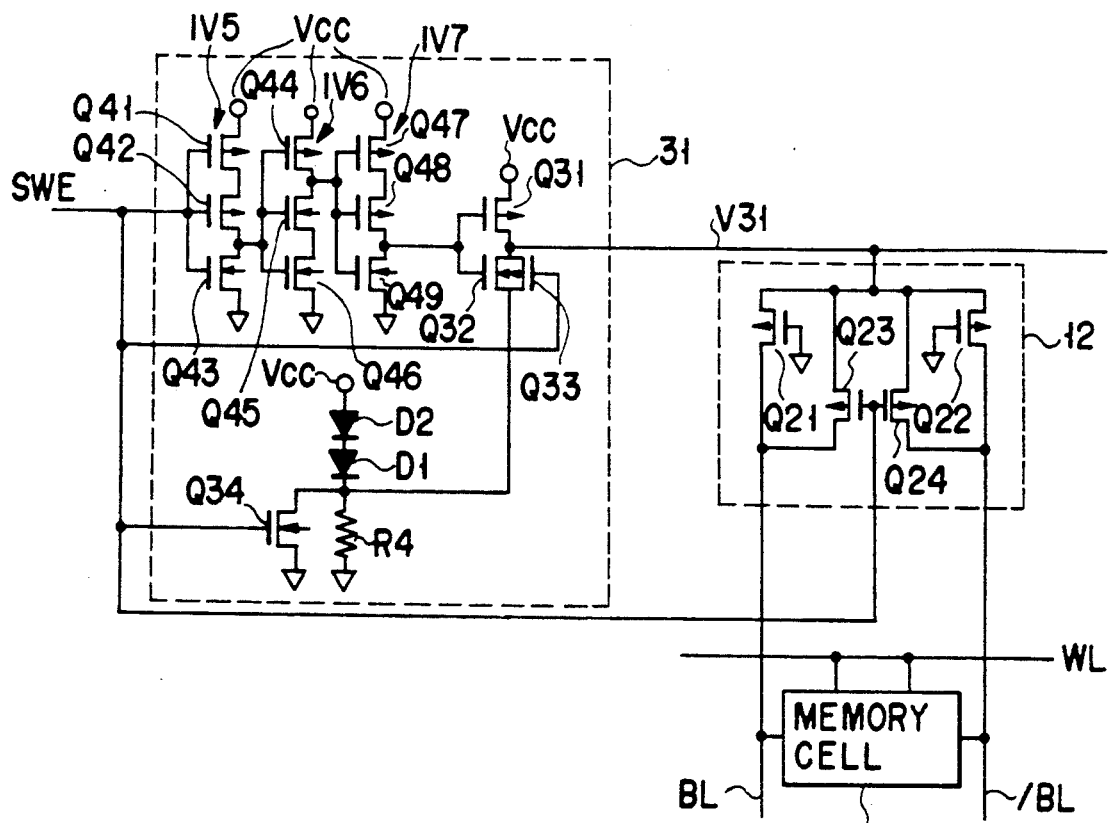
F I G. 6
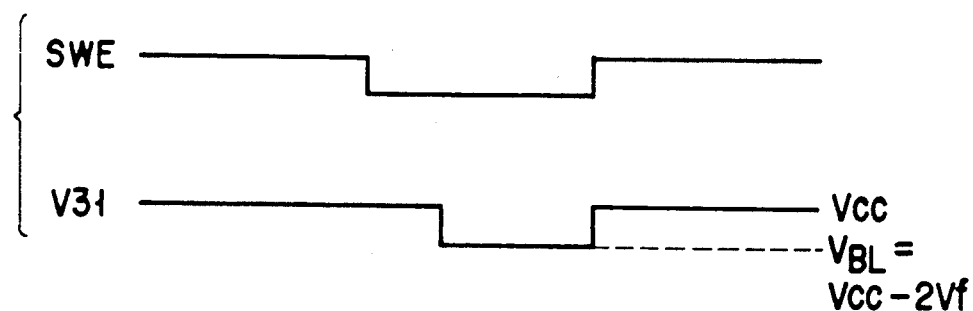
F I G. 7
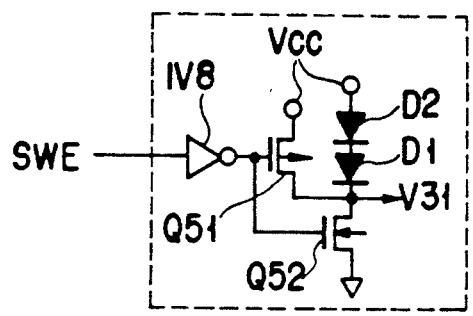
F I G. 8

STATIC MEMORY DEVICE

BACKGROUND OF THE INVENTION

1. Field of the Invention

This invention relates to a static memory device, and more particularly to a static memory device which writes and reads data at a high speed.

2. Description of the Related Art

In a static random access memory (hereinafter referred to as a SRAM), data is transmitted from a write circuit through a bit line and written in a memory cell selected on the basis of a row selection signal output from a row decoder and a column selection signal output from a column decoder.

In a data reading operation, data is read from a memory cell selected in the same manner as described above. The data is supplied through a bit line to a sense amplifier and amplified therein. Recently, some BICMOS circuits consisting of CMOS FETs and bipolar transistors have a sense amplifier formed of bipolar transistors.

In a conventional SRAM using a CMOS FET and a bipolar transistor, the potential of a bit line is precharged to a value $V_{BL} = V_{cc} - 2V_f$ or $V_{cc} - V_f$ because of the use of bipolar sense amplifier, where $V_{cc}$ denotes a supply voltage and $V_f$ denotes a base-emitter forward bias voltage and the emitter of the bipolar transistor. Therefore, when data is written, the voltage margin to correctly write data is small and a write time is long.

When data writing and data reading are consecutively performed, the time required to read data through a pair of bit lines connected to a memory cell in which data has just been written is different from the time required to read the data through another pair of bit lines. More specifically, when the later pair of bit lines is accessed, the two bit lines are precharged to a potential of $V_{BL}$ (e.g., $V_{cc} - 2V_f$), and accordingly, data can be read out in a relatively short period of time. However, when the pair of bit lines connected to the memory cell in which data has just been written is accessed again to read data from another memory cell (or the same memory cell), a relatively long period of time is required. For example, in one write cycle, one of the pair of bit lines is set at the potential of $V_{cc} - 2V_f$ and the other bit line is set at a lower level. When a data reading operation starts, it takes a considerable period of time to return the lower potential level of the pair of bit lines to the level of $V_{BL}$. In addition, it requires much longer time to read data in a memory cell of a high level through a bit line which is set at a low level in previous write cycle, since the potential of the bit line must be inverted.

SUMMARY OF THE INVENTION

The present invention has been developed to overcome the above drawback, and has as its object to provide a static memory device wherein a write time can be reduced by increasing the voltage margin in writing and data can be read from a memory cell at a high speed, even if a bit line connected to a memory cell in which data has been written in the latest memory cycle is accessed.

According to the present invention, there is provided a static memory comprising:

a memory cell array having a plurality of sections each including a plurality of static memory cells, the static memory cells being arranged at positions where a plurality of pairs of bit lines cross a plurality of word lines;

a selection signal generating circuit for generating a selection signal for selecting one of the sections in accordance with a data writing or reading operation; and a potential generating circuit for generating first and second potentials of high logic level and supplying the first and second potentials to a pair of bit lines in one of the plurality of sections in response to the selection signal output from the selection signal generating circuit.

With the above structure, the pair of bit lines are precharged to a first potential, e.g., a supply voltage $V_{cc}$ in a data writing operation, and to a second potential, e.g., $V_{cc} - 2V_f$ ($V_f$ is a forward voltage of a diode) in a data reading operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

FIG. 1 is a schematic block diagram show a SRAM according to a first embodiment of the present invention;

FIG. 2 is a circuit diagram showing in detail a main part of the SRAM shown in FIG. 1;

FIG. 6 is a circuit diagram showing a third embodiment of the present invention;

FIG. 7 is a timing chart for explaining an operation of the circuit shown in FIG. 6; and FIG. 8 is a circuit diagram showing a modification of the circuit for generating a bit line potential of the present invention.

DETAILED DESCRIPTION OF THE PREFERRED EMBODIMENTS

Figure 3:
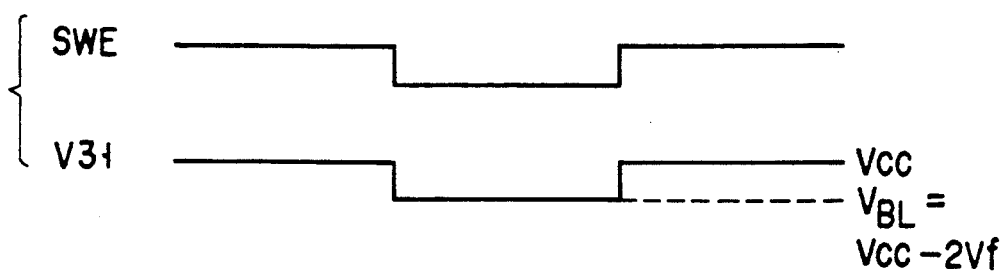
FIG. 3 is a timing chart for explaining an operation of the circuit shown in FIG. 2.

Embodiments of the present invention will now be described with reference to the accompanying drawings.

FIG. 1 shows a structure of the SRAM according to a first embodiment of the present invention, in which part of a memory cell array consisting of a plurality of sections is shown.

Referring to FIG. 1, bit lines BL and /BL and a word line WL are connected to a memory cell 11. The bit lines BL and /BL are also connected to a bit line precharge circuit 12 and a column selection circuit 13. In the whole SRAM, the number of the bit line precharge circuits is the same as the number of the pairs of bit lines. For example, if the chip is a 4M-bit memory, it has 4096 bit line precharge circuits.

An address signal is supplied to an address input circuit 15, which is connected to a row decoder 16 and a column decoder 17. The row decoder 16 decodes an address signal to select the word line WL. The column decoder 17 decodes an address signal to select the bit lines BL and /BL through the column selection circuit 13.

The column selection circuit 13 is connected to output terminals of a writing circuit 18 for writing data into a selected memory cell 11 and input terminals of a sense amplifier 19 for amplifying data read from the selected memory cell. The sense amplifier 19 is connected to another sense amplifier (not shown).

The writing circuit 18 is connected to writing control circuit 20. The writing control circuit 20 has a first input terminal 21 through which data is input and a second input terminal 22 through which a write control signal is input. The write control circuit 20 is connected to SWE (section write enable) signal generating circuit 23. In general, one memory chip has one SWE signal generating circuit 23. As mentioned above, a memory cell array is divided into a plurality of sections (for example, 16 to 32 sections in a 1M-bit memory). The SWE signal generating circuit 23 generates an SWE signal for selecting a section in accordance with an address signal supplied from the address input circuit 15. The SWE signal is supplied to the bit line precharge circuit 12 and a bit line potential generating circuit 31.

FIG. 2 shows a main part of the SRAM shown in FIG. 1. The bit line precharge circuit 12 comprises P-channel MOS FETs (hereinafter referred to as P-channel transistors) Q21, Q22, Q23, and Q24. The sources of the P-channel transistors Q21 to Q24 are connected to the drain of a P-channel transistor Q31 of the bit line potential generating circuit 31. The drains of the P-channel transistor Q21 and Q23 are connected to the bit line BL. Each section has one bit line potential generating circuit 31. The drains of the P-channel transistors Q22 and Q24 are connected to the bit line /BL. The gates of the P-channel transistors Q21 and Q22 are grounded, and these transistors function as resistors having a resistance of large value. The gates of the P-channel transistors Q23 and Q24 are connected to each other, and receive the SWE signal output from the SWE signal generating circuit 23.

The memory cell 11 comprises four N-channel MOS FETs (hereinafter referred to as N-channel transistors) Q25, Q26, Q27, and Q28, and two resistors R1 and R2.

The column selection circuit 13 comprises CMOS transfer gates T1 and T2 respectively connected to the bit lines BL and /BL. The writing circuit 18 comprises CMOS inverter circuits IV1 and IV2 respectively connected to the bit lines BL and /BL through the transfer gates.

The sense amplifier 19 comprises NPN transistors Q29 and Q30 having bases which is respectively connected to the bit lines BL and /BL and a resistor R3 which is connected to the emitters of the transistors Q2 and Q30.

The bit line potential generating circuit 31 applies two types of potential to the bit line precharge circuit 12 in response to the SWE signal for selecting a section of the memory cell array.

The SWE signal is supplied to the gates of a P-channel transistor Q31 and an N-channel transistor Q32 through an inverter circuit IV3. The source of the P-channel transistor Q31 is connected to supply voltage $V_{cc}$. The drain of this P-channel transistor Q31 is connected to the drain of the N-channel transistor Q32 and the source of a P-channel transistor Q33. The drain of the transistor Q31 is also connected through a wire V31 to the sources of the P-channel transistors Q21 to Q24 constituting the bit line precharge circuit 12. The gate of the P-channel transistor Q33 is connected to an input terminal of the inverter circuit IV3. The P-channel transistor Q33 and the N-channel transistor Q32 constitute a transfer gate.

The input terminal of the inverter circuit IV3 is connected to the gate of an N-channel transistor Q34. The N-channel transistor Q34 functions as a resistor of a large resistance, when a high level signal is input through its gate. The source of the N-channel transistor Q34 is grounded, and the drain thereof is grounded through a resistor R4 and connected to the power source $V_{cc}$ through diodes D1 and D2 which are connected in series. The resistance of the resistor R4 is larger than that of the N-channel transistor Q34 in an ON state. Therefore, a current of a predetermined value or above constantly flows through the diodes D1 and D2, whether in a data writing operation or data reading operation (to be described later). In other words, the potential of the cathode of the diode D1 is always set at the bit line potential $V_{BL} = V_{cc} - 2V_f$. The drain of the N-channel transistor Q34 is connected to the source of the N-channel transistor Q32 and the drain of the P-channel transistor Q33.

In the above structure, as shown in FIG. 3, when the SWE signal is of high level, i.e., in a data writing operation, the P-channel transistor Q31 is turned on, and the N-channel transistor Q32 and the P-channel transistor Q33 are turned off. Accordingly, an output potential V31 of the bit line potential generating circuit 31 is equal to the power source potential $V_{cc}$. The potential of the bit lines BL and /BL is also equal to $V_{cc}$.

In this embodiment, in a data writing operation, the potential of the bit lines is set to the supply voltage $V_{cc}$. Accordingly, the noise margin of the source voltage and the data writing speed can be increased.

Figure 4:
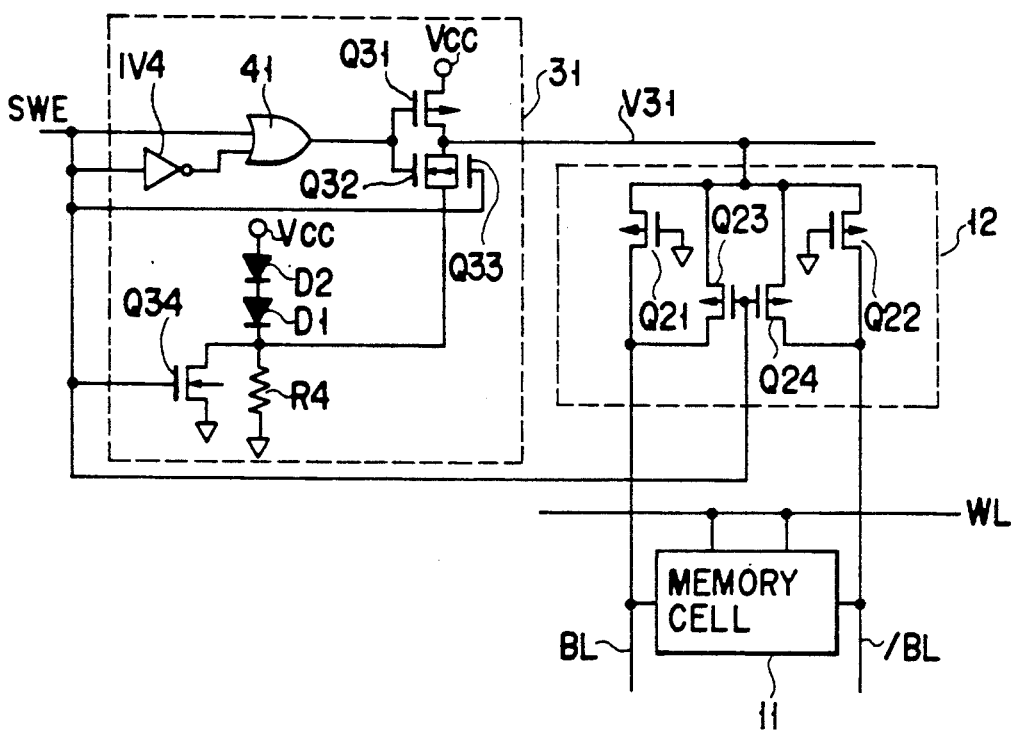
FIG. 4 is a circuit diagram showing a second embodiment of the present invention.

FIG. 4 shows a second embodiment of the present invention. In FIG. 4, components like those in FIG. 2 are identified with like reference numerals as used in FIG. 2, and only different components will now be described.

In the second embodiment, an SWE signal is supplied to one input terminal of an OR circuit 41. It is also supplied to the other input terminal of the OR circuit 41 through an inverter circuit IV4 having a predetermined delay time Td1. An output terminal of the OR circuit 41 is connected to the gates of the P-channel transistor Q31 and the N-channel transistor Q32.

Figure 5:
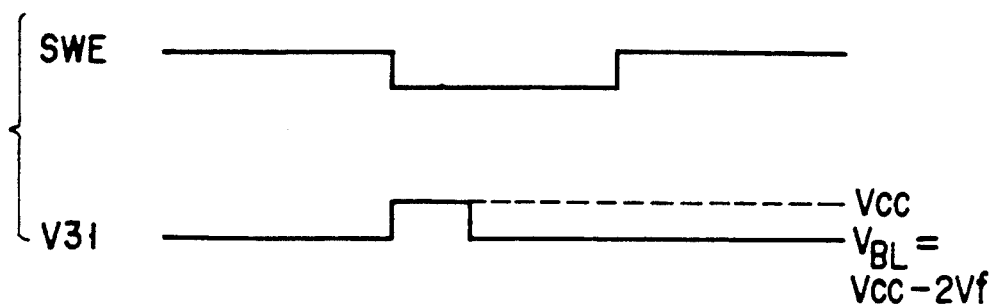
FIG. 5 is a timing chart for explaining an operation of the circuit shown in FIG. 4.

In the above structure, as shown in FIG. 5, when the level of the SWE signal is high, i.e., in a data writing operation, a high level signal is output from the OR circuit 41. As a result, the P-channel transistor Q31 is turned off, and the N-channel transistor Q32 and the P-channel transistor Q33 are turned on. Hence, the output potential V31 of the bit line potential generating circuit 31 is equal to the bit line potential $V_{BL}$ generated by the diodes D1 and D2. The potential of the bit lines BL and /BL is also $V_{BL}$.

When the level of the SWE signal is low, i.e., in a data reading operation, a low level signal is output from the OR circuit 41 for the delay time Td1 set in the inverter circuit IV4. Owing to the low level signal, the P-channel transistor Q31 is turned on and the N-channel transistor Q32 and the P-channel transistor Q33 are turned off. Accordingly, the output potential V31 of the bit line potential generating circuit 31, i.e., the potential of the bit line, is changed to the supply voltage $V_{cc}$ for the delay time Td1, and thereafter set at the potential $V_{BL}$.

According to the above embodiment, the supply voltage $V_{cc}$ is supplied to the bit lines in the first period Td1 of a data reading period, although voltage $V_{cc} - 2V_f$ is supplied to the bit lines in conventional circuits. This aims at precharging the bit lines to the level of $V_{BL}$ at a high speed in a data reading operation. With this operation, the data reading time can be reduced.

FIG. 6 shows a third embodiment of the present invention. In FIG. 6, components like those in FIGS. 2 and 4 are identified with like reference numerals as used in these figures, and only different components will now be described.

In this embodiment, an SWE signal is supplied to the gates of the P-channel transistor Q31 and the N-channel transistor Q32 through three inverter circuits IV5, IV6, and IV7 connected in series. The inverter circuit IV6 outputs a signal such that the time required for inverting the signal from the low level to the high level is shorter than that required for inverting the signal from the high level to the low level. The inverter circuits IV5 and IV7 output signals such that the time required for inverting the signal from the high level to the low level is shorter than that required for inverting the signal from the low level to the high level.

The SWE signal is supplied to the gates of P-channel transistors Q41 and Q42 and of an N-channel transistor Q43 constituting the inverter circuit IV5. The P-channel transistors Q41 and Q42 and the N-channel transistor Q43 are connected in series between the power source $V_{cc}$ and the ground. The drain of the P-channel transistor Q42 and the drain of the N-channel transistor Q43 are connected to the gates of P-channel transistor Q44, N-channel transistors Q45 and Q46, which constitute the inverter IV6. The P-channel transistor Q44 and the N-channel transistors Q45 and Q46 are connected in series between the power source $V_{cc}$ and the ground. The drain of the P-channel transistor Q44 and the drain of the N-channel transistor Q45 are connected to the gates of P-channel transistors Q47 and Q48 and an N-channel transistor Q49. The P-channel transistors Q47 and Q48 and the N-channel transistor Q49 are connected in series between the power source $V_{cc}$ and the ground. The drain of the P-channel transistor Q48 and the drain of the N-channel transistor Q49 are connected to the gates of the P-channel transistor Q31 and the N-channel transistor Q32.

In the above structure, as shown in FIG. 7, when the level of the SWE signal is high, i.e., in a data writing operation, a low level signal is output from the inverter circuit IV7. As a result, the P-channel transistor Q31 is turned on, and the N-channel transistor Q32 and the P-channel transistor Q33 are turned off. Hence, the output voltage V31 of the bit line potential generating circuit 31 is equal to the supply voltage $V_{cc}$. The voltage of the bit lines BL and /BL is also $V_{cc}$. Since the potential of the bit lines is set to the supply voltage $V_{cc}$ in a data writing operation, as in the first embodiment, the noise margin and the data writing speed can be increased.

When the level of the SWE signal is low, i.e., in a data reading operation, the inverter circuit IV7 continues outputting a low level signal for a delay time Td2 set in the inverter circuits IV5, IV6, and IV7. Thereafter, the inverter IV7 outputs a high level signal. Therefore, the output voltage V31 of the bit line potential generating circuit 31 is kept at the source potential $V_{cc}$ for the period of the delay time Td2, and then changed to the bit line potential $V_{BL}$ generated by the diodes D1 and D2. As in the second embodiment, the voltage of the bit lines is set to the supply voltage $V_{cc}$ for a while and thereafter set to the level of $V_{BL} = V_{cc} - 2V_f$. Hence, even when data is read from a memory cell connected to a bit line which has been selected to write data one cycle before, or when data of the level opposite to that of the data which has just been written is read, the delay in reading time can be reduced.

To set potentials of all the bit lines in a memory chip, a considerable period of time is required for charging and discharging, since the bit lines have great capacities. However, according to this embodiment, since a memory cell array is divided into a plurality of sections and the potential of the bit line only in the selected section is changed, the capacities of the bit lines can be smaller and the bit lines can be charged and discharged at a high speed.

FIG. 8 shows another example of the circuit for generating the potential $V_{BL}$ in a bit line.

An SWE signal is supplied to an input terminal of an inverter circuit IV8. An output of the inverter circuit IV8 is applied to the gates of a P-channel transistor Q51 and an N-channel transistor Q52. The source of the P-channel transistor Q51 is connected to the power source $V_{cc}$, and the drain thereof is connected to the drain of the N-channel transistor Q52. The source of the N-channel transistor Q52 is grounded, and the drain thereof is connected to the power source $V_{cc}$ through the diodes D1 and D2 and also connected to the wire V31. The N-channel transistor Q52 serves as a resistor in an on state as the transistor Q35 in FIG. 2.

In a data writing operation, i.e., when the level of the SWE signal is logically high, the P-channel transistor Q51 is turned on and the N-channel transistor Q52 is turned off. Accordingly, the voltage $V_{cc}$ is applied to the bit lines. In a data reading operation, i.e., when the level of the SWE signal is logically low, the P-channel transistor Q51 is turned off and the N-channel transistor Q52 is turned on. Accordingly, a current flows through the diodes D1 and D2, and the bit line potential is set to the level of $V_{cc} - 2V_f$.

The present invention is particularly effective for a devices in which an operation voltage is 3.3 V.

The present invention is not limited to the above embodiments but various modifications may be made within the spirit and scope of the invention.

What is claimed is:

1. A static memory device comprising:
   a memory cell array having a plurality of sections each including a plurality of static memory cells, said static memory cells being arranged at positions where a plurality of pairs of bit lines cross a plurality of word lines;
   a selection signal generating circuit for generating a selection signal for selecting one of the sections in accordance with a data writing or reading operation; and
   a potential generating circuit for generating first and second potentials of logically high level and supplying the first and second potentials to a pair of bit lines in one of said plurality of sections in response to the selection signal output from said selection signal generating circuit.

2. A static memory device according to claim 1, wherein said potential generating circuit comprises a circuit for supplying the first potential to the pair of bit lines in a data writing operation, and the second potential to the pair of bit lines in a data reading operation, in response to the selection signal.

3. A static memory device according to claim 1, wherein said potential generating circuit comprises a circuit for supplying the first potential to the pair of bit lines for a predetermined period of time in response to the selection signal only in a data reading operation.

4. A static memory device according to claim 1, wherein said potential generating circuit comprises a circuit for supplying the first potential to the pairs of bit lines for a predetermined period of time in response to the selection signal, and thereafter supplying the second potential to the pairs of bit lines in a data reading operation.

5. A static memory device for writing/reading data in/from one memory cell of a plurality of memory cells in response to an address signal, said device comprising:
   means, having a plurality of word lines, for selecting one of the word lines in response to the address signal;
   means, having a plurality of pairs of bit lines, for selecting one of the pairs of bit lines in response to the address signal;
   a memory cell array having a plurality of sections each including a plurality of memory cells respectively connected to the word lines and the pairs of bit lines;
   means for selecting one of said plurality of sections in response to the address signal; and
   means for generating a first potential and a second potential which is lower than the first potential, and supplying one of the first and the second potentials to the pairs of bit lines in the selected section in response to the signal generated from said section selecting means, depending on whether data is written or read.

6. A static memory device according to claim 5, wherein said potential generating means comprises a circuit for supplying the first potential to the pairs of bit lines in a data writing operation, and the second potential to the pairs of bit lines in a data reading operation, in response to a signal output from said section selecting means.

7. A static memory device according to claim 5, wherein said potential generating means comprises a circuit for supplying the first potential to the pairs of bit lines for a predetermined period of time in response to a signal output from said section selecting means, in a data reading operation.

8. A static memory device according to claim 5, wherein said potential generating means comprises a circuit for supplying the first potential to the pairs of bit lines for a predetermined period of time in response to a signal output from said section selecting means, and thereafter supplying the second potential to the pair of bit lines in a data reading operation.

9. A static memory device according to claim 5, wherein said potential generating means comprises:
   first and second diodes, the anode and the cathode of said second diode being respectively connected to a power source of the memory device and the anode of said first diode, and the cathode of said first diode being connected to the plurality of pairs of bit lines;
   an FET transistor, the gate thereof being supplied with a signal output from said section selecting means, one output terminal thereof being connected to the cathode of said first diode, and the other output terminal being grounded; and
   a resistor element, one terminal thereof being connected to the cathode of said first diode and the other terminal being grounded.

10. A static memory device according to claim 5, wherein the first potential is a supply voltage $V_{cc}$ of the memory device and the second potential is $V_{BL}$ obtained by one of the following equations:

$$V_{BL}=V_{cc}-nV_f \text{ and } V_{BL}=V_{cc}-nV_{th}$$

where $V_f$ is a forward voltage of a diode, $V_{th}$ is a threshold voltage of a MOSFET and n is a whole number.

11. A static memory device comprising:
   a memory cell array having a plurality of static memory cells, said static memory cells being arranged at positions where a plurality of pairs of bits lines cross a plurality of word lines;
   a selection signal generating circuit for generating a selection signal in accordance with a data writing or reading operation; and
   a potential generating circuit for generating first and second potentials corresponding to a high logic level and for supplying the first and second potentials to a pair of bit lines in response to the selection signal output from said selection signal generating circuit.

12. A static memory device according to claim 11, wherein said potential generating circuit supplies the first potential to the pair of bit lines in a data writing operation, and the second potential to the pair of bit lines in a data reading operation.

13. A static memory device according to claim 11, wherein said potential generating circuit supplies the first potential to the pair of bit lines for a predetermined period of time in response to the selection signal only in a data reading operation.

14. A static memory device according to claim 11, wherein said potential generating circuit supplies the first potential to the pairs of bit lines for a predetermined period of time in response to the selection signal, and thereafter supplies the second potential to the paris of bit lines in a data reading operation.

* * * * *